(12) United States Patent
Bakker et al.

(10) Patent No.: US 6,906,788 B2
(45) Date of Patent: Jun. 14, 2005

(54) LITHOGRAPHIC PROJECTION APPARATUS WITH MULTIPLE SUPPRESSION MESHES

(75) Inventors: Levinus Pieter Bakker, Helmond (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/717,929

(22) Filed: Nov. 21, 2003

(65) Prior Publication Data

US 2004/0135985 A1 Jul. 15, 2004

(30) Foreign Application Priority Data

Nov. 22, 2002 (EP) ............................................ 02079864

(51) Int. Cl.[7] ........................ G03B 27/72; G03B 27/42; G03B 27/52
(52) U.S. Cl. .............................. 355/69; 355/53; 355/30
(58) Field of Search ....................... 355/30, 53, 67–71; 250/492.2

(56) References Cited

U.S. PATENT DOCUMENTS 6,614,505 B2 * 9/2003 Koster et al. ................. 355/30

2002/0109828 A1 * 8/2002 Moors et al. ................. 355/76

FOREIGN PATENT DOCUMENTS

EP          1 182 510 A1      2/2002

OTHER PUBLICATIONS

Nguyen et al., "Imaging of extreme ultraviolet lithographic masks with programmed substrate defects," *J. Vac. Sci. Technol. B* 12(6):3833–3840, XP–002096163 (1994).

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is disclosed. The apparatus includes a radiation system to transmit a beam of radiation emitted from a radiation source, and a support structure constructed to hold a patterning structure to be irradiated by the beam. A substrate holder is constructed to hold a substrate, and a projection system is constructed and arranged to project an irradiated portion of the patterning structure onto a target portion of the substrate. A first screen is positioned in a path of the beam between the radiation system and an optical element and a positive voltage is applied to the first screen to repel positively charged particles away from the optical element. A second screen is positioned in the path of the beam on at least one side of the first screen, and a negative voltage is applied to the second screen to repel negative particles away from the first screen.

17 Claims, 4 Drawing Sheets

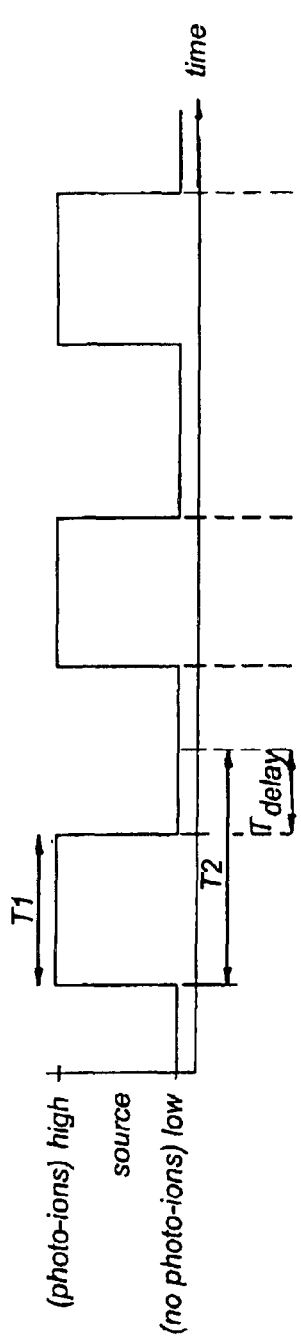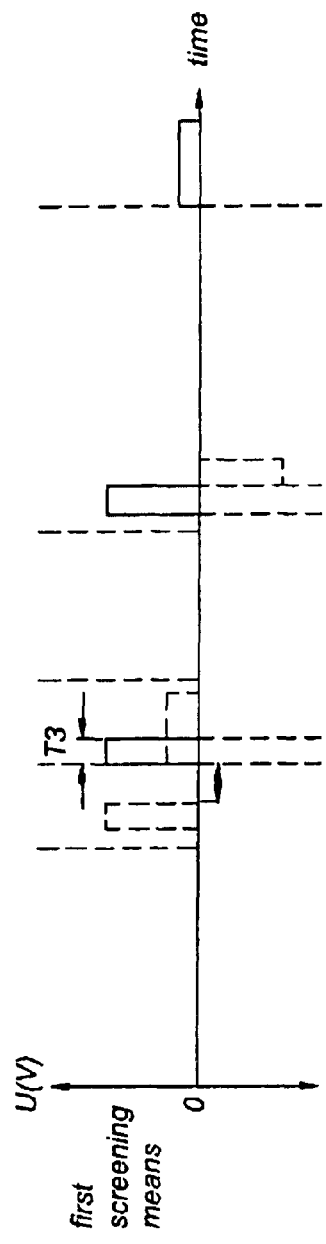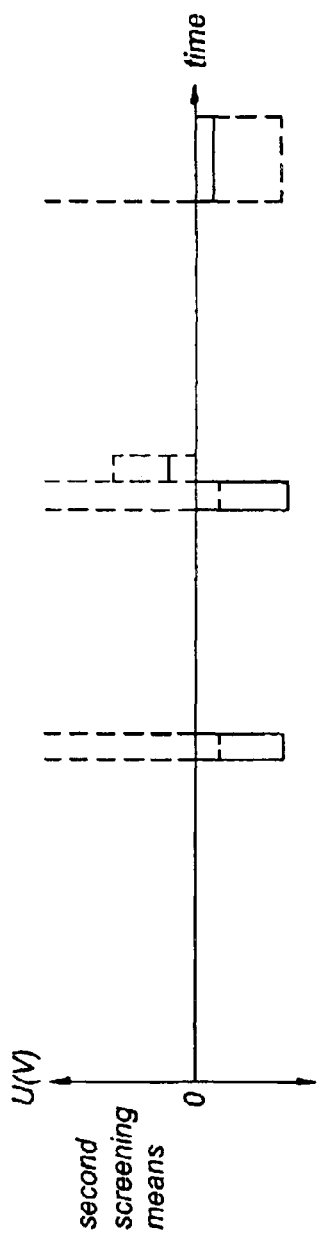
Fig 6a
Fig 6b
Fig 6c

LITHOGRAPHIC PROJECTION APPARATUS WITH MULTIPLE SUPPRESSION MESHES

CROSS-REFERENCE TO RELATED APPLICATIONS

This application is based on and claims priority from European Patent Application No. 02079864.1 filed on Nov. 22, 2002, the contents of which are incorporated herein by reference.

BACKGROUND OF THE INVENTION

1. Field of the Invention

The present invention relates generally to the field of lithography. More specifically, the present invention relates to a screen for an optical element.

2. Description of Related Art

The term "patterning device" or "patterning structure" as here employed should be broadly interpreted as referring to means or structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In a lithographic apparatus, the size of features that can be imagined onto the substrate is limited by the wavelength of the projection radiation. To produce integrated circuits with a higher density of devices, and hence higher operating speeds, it is desirable to be able to image smaller features. Whilst most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft x-ray and possible sources include, for instance, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 run) Light Source Employing a Dense Plasma Focus in Lithium Vapor", Proc. SPIE 3997, pp. 136–156 (2000); M. W. McGeoch, "Power Scaling of a Z-pinch Extreme Ultraviolet Source", Proc. SPIE 3997, pp. 861–866 (2000); W. T. Silfvast, M. Klosner, G. Shimkaveg, H. Bender, G. Kubiak, N. Fornaciari, "High-Power Plasma Discharge Source at 13.5 and 11.4 nm for EUV lithography", Proc. SPIE 3676, pp. 272–275 (1999); and K. Bergmann et al., "Highly Repetitive, Extreme Ultraviolet Radiation Source Based on a Gas-Discharge Plasma", Applied Optics, Vol. 38, pp. 5413–5417 (1999).

EUV radiation sources, such as discharge plasma radiation sources referred to above, may require the use of a rather high partial pressure of a gas or vapor to emit EUV radiation. In a discharge plasma source a discharge is created between electrodes, and a resulting partially ionized plasma may subsequently be caused to collapse to yield a very hot plasma that emits radiation in the EUV range. The very hot plasma is quite often created in Xe, since a Xe plasma radiates in the Extreme UV (EUV) range around 13.5 nm. For an efficient EUV production, a typical pressure of 0.1 mbar is required near the electrodes to the radiation source. A drawback of such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To achieve this, the source can be contained in its own vacuum chamber that is separated by a chamber wall from a subsequent vacuum chamber in which the collector mirror and illumination optics may be obtained.

An EUV lithographic projection apparatus as described above is known from EP-1 182 510. This document discloses in embodiment 7 and FIGS. 9 to 12, a mesh on a high positive potential (high voltage mesh) that is used to prevent the delicate coating of optical components in the lithographic apparatus from being sputtered. The mesh is positioned as a screen in front of the optical components and, because of a high positive potential, repels particles with a positive charge. The mesh comprises a plurality of parallel wires. The thickness of each wire is much smaller than the distance between adjacent wires. This ensures that the mesh does not obscure the projection beam of radiation significantly and that the meshes are substantially transparent to the projection beam of radiation. Positively charged particles approaching optical components will be repelled or slowed down by the positive bias of the mesh and become deflected. However, the high positive voltage attracts free electrons to the mesh. This results in several disadvantages such as: high power consumption in the mesh and the resulting heating of the mesh and the need for large high voltage power supplies for the mesh and the possibility of a gas discharge in the vicinity of the mesh. Furthermore, the accompanying extending electric field results in electrical breakdown of the gas between the mesh and another surface and has a negative influence on the EUV source performance in the lithographic projection apparatus.

BRIEF SUMMARY OF THE INVENTION

At least one aspect of embodiments of the present invention is directed to reduce the number of free electrons that reach the high voltage mesh, and to confine the electric field.

In at least one embodiment of the present invention, a lithographic projection apparatus is provided that includes a radiation system to transmit a beam of radiation emitted from a radiation source, and a support structure constructed to hold a patterning structure to be irradiated by the beam of radiation. The patterning structure is adapted to pattern the beam. A substrate holder is constructed to hold a substrate, and a projection system is constructed and arranged to project an irradiated portion of the patterning structure onto a target portion of the substrate. A first screen is positioned in a path of the beam of radiation between the radiation source and an optical element to be screened from positively charged particles. The first screen is substantially transparent to the projection beam of radiation, and a positive voltage is applied to the first screen to repel at least a portion of the positively charged particles away from the optical element. A second screen is positioned in the path of the beam of radiation on at least one side of the first screen, and a negative voltage is applied to the second screen to repel negative particles away from the first screen.

At least one embodiment of the present invention provides a method of manufacturing an integrated structure by a lithographic process. The method includes transmitting a beam of radiation emitted from a radiation source, patterning the beam of radiation, projecting the beam of radiation onto a substrate, screening the beam of radiation between the radiation source and at least one optical component with a first screen by applying a positive voltage to the first screen, and screening the beam of radiation on at least one side of the first screen with a second screen by applying a negative voltage to the second screen.

At least one embodiment of the invention relates to a lithographic projection apparatus comprising: a radiation system to form a projection beam of radiation, from radiation emitted by a radiation source, a support structure constructed to hold a patterning structure, to be irradiated by the projection beam to pattern said projection beam, a substrate table constructed to hold a substrate, a projection system constructed and arranged to image an irradiated portion of the patterning structure onto a target portion of the substrate, and first screening means positioned in the path of the projection beam of radiation between the radiation source and an object to be screened from positively charged particles, the first screening means being substantially transparent to the projection beam of radiation, and a positive voltage being applied to the first screening means for forming a potential barrier to block at least a portion of the positively charged particles.

To this end, at least one embodiment of the invention is characterized in that second screening means are positioned in the path of the projection beam of radiation on at least one side of the first screening means, a negative voltage being applied to the second screening means for repelling negatively charged particles away from the first screening means. The negative voltage repels negatively charged particles, e.g., the above mentioned free electrons, thereby leaving the surroundings of the first screening means or the first mesh virtually free of said negatively charged particles. Hence, the number of free electrons that become incident on the first mesh is strongly reduced and a high current through the mesh and a high power consumption in the mesh may be prevented. Furthermore, the second screening means act as a Faraday cage, preventing the electric field lines to reach the source and the delicate optical components.

Another embodiment of the invention is characterized in that the lithographic projection apparatus further comprises a surface which is either grounded or in electrical contact with the second screening means for screening the radiation source from the first screening means. The shielding makes it possible to conveniently operate the EUV source and to introduce a high voltage on the first mesh. A negative voltage may be applied to the resulting structure comprising the second screening means and the surface. Alternatively, the said surface may be grounded and a negative voltage may have been applied to the second screening means. Electrons (and electric field lines) can still cross a grounded structure. A negative voltage applied to the said structure prevents electrons and electric field lines to cross the structure. For a closed structure this negative voltage is not necessary. When holes are present in the structure to allow EUV radiation to pass, for instance when the second screening means comprise a mesh, the dimensions of the holes determine the negative voltage needed for the screening.

Further embodiments of the invention are characterized by the surface comprising a cylindrically or conically shaped casing, its longitudinal axis being substantially parallel to the path of the projection beam of radiation, and by the first screening means and second screening means comprising a grid or mesh structure, having a surface substantially perpendicular to the path of the projection beam of radiation. These relative simple geometries have been tested and function well. Moreover, such simple geometries are relatively easy and inexpensive to manufacture. The geometry used may depend on whether the projection beam of radiation is parallel, convergent, or divergent. For a cylindrically shaped casing parallel to the path of the projection beam of radiation, the casing can be closed and can be grounded.

Again, another embodiment the invention is characterized in that the second screening means and the first screening means comprise apertures which are mutually aligned along the path of the projection beam of radiation. The alignment of second screening means with the first screening means, which both may be mesh structures, minimizes the interception of the projection beam of radiation and hence maximizes the amount of radiation power present downstream of the meshes. The alignment of the meshes can be such that the radiation power downstream of the meshes is maximized for a convergent, for a parallel and for a divergent projection beam of radiation.

In still another embodiment the invention is characterized in that the lithographic projection apparatus further comprises third screening means substantially at ground potential, positioned on the side of the second screening means opposite the side facing the first screening means. This further reduces the influence of the electric fields generated by the first and second screening means in the vicinity of the source. The secondary electrons will not be able to reach the positively charged mesh and the EUV source will operate in a smooth and stable way. The third screening means prevents operational problems with the second screening means due to extending electric fields and accelerated electrons. Furthermore, the third screening means produce a shaded region in which other screening means may be positioned. The radiation impinging on the third screening means produces secondary electrons, which would be produced at the second screening means without the presence of the third screening means. The secondary electron current may come from the third screening means, instead of the second screening means, since the electron current from the second screening means results in a temporary increase of negative voltage, even to zero potential.

Again, other embodiments of the invention are characterized by a positive voltage between about 0 V and about 20 kV, preferably about 3 kV, being applied to the first screening means, and by a negative voltage between about −2 kV and about 0 V, preferably about −400 V, being applied to the second screening means. These values for the potentials of the electric fields have turned out to be particularly favorable.

Another embodiment of a lithographic projection apparatus according to the invention is characterized in that the radiation source is adapted to be operated in a pulsed manner between a high—radiating—state and a low—non-radiating—state, and in that the lithographic projection apparatus further comprises synchronization means, which synchronization means are adapted to apply to the first screening means a positive voltage during at least a part of the time the radiation source is in its low state. The high voltage on the first screening means repels positive ions generated by the source and prevents them from entering the optical system downstream of the screening means. However, photo ions that are generated by the EUV-beam downstream of the screening means are prevented from being accelerated into the optical system by only operating the screening means during the time when the source is in its low state, and by only operating the screening means when no photo ions are present. There may be a predetermined voltage applied to the second screening means. This voltage may be pulsed in synchronism with the source, but pulsing of the second screening means is not necessary. The predetermined voltage may also be constant.

The high voltage on the screening means may be switched off at the moment the source-produced ions have been decelerated to prevent the source produced ions from being repelled back towards the source.

In another embodiment the invention is characterized in that at least one wall is present in between the first screening means and the second screening means for capturing positively charged particles. In particular, in combination with electric or magnetic fields directing the ions towards these walls, this facilitates the decay of the photo ions further, as the mean free path of the photo ions is decreased by introducing extra walls. The walls can be conducting or insulating. The extra walls should be arranged so as to minimize obscuration of the EUV beam by the walls.

In another embodiment the invention is characterized in that said lithographic projection apparatus comprises photo ion capture means for attracting positively charged particles towards the at least one wall. By applying a relatively small electric and/or magnetic force, with at least one component directed perpendicular towards the at least one wall, the photo ions will be removed from the optical system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 shows timing graphs used to explain operation of the present invention.

DETAILED DESCRIPTION

Figure 1:
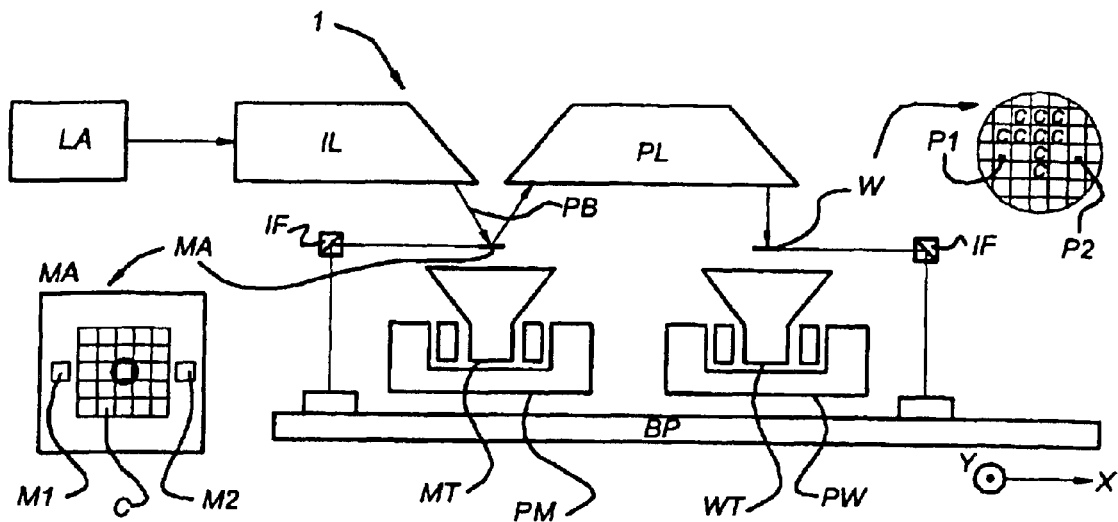
FIG. 1 schematically depicts a lithographic projection apparatus according to an embodiment of the invention.

FIG. 1 schematically depicts a lithographic projection apparatus 1 according to a particular embodiment of the invention. The apparatus comprises a radiation system for supplying a projection beam PB of radiation (e.g. EUV radiation with a wavelength of 11–nm), a first object table (mask table) MT provided with a mask holder for holding a mask MA (e.g. a reticle), and connected to first positioning means PM for accurately positioning the mask with respect to item PL, a second object table (substrate table) WT provided with a substrate holder for holding a substrate W (e.g. a resist coated silicon wafer), and connected to second positioning means PW for accurately positioning the substrate with respect to item PL, and a projection system ("lens") PL for imaging an irradiated portion of the mask MA onto a target portion C (e.g. comprising one or more dies) of the substrate W. In this particular case, the radiation system also comprises a radiation source LA. The term mask table as used herein can also be considered or termed as a mask support. It should be understood that the term object table broadly refers to a structure that supports, holds, or carries a mask or a substrate.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2, respectively.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution.

Figure 2:
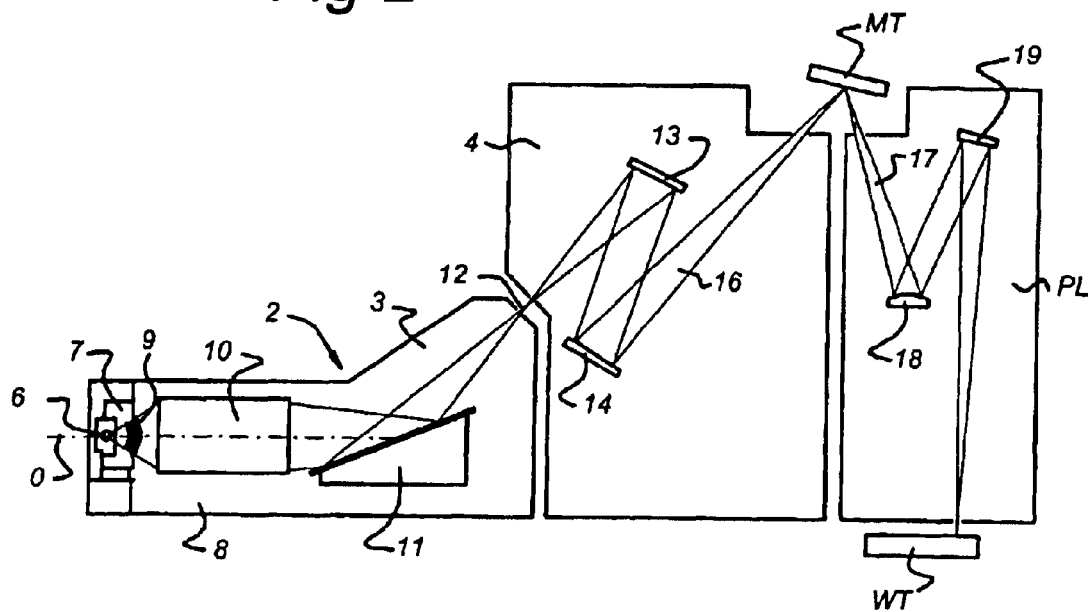
FIG. 2 shows a side view of an EUV radiation system and projection optics of a lithographic projection apparatus according to FIG. 1.

FIG. 2 shows the projection apparatus 1 comprising a radiation system 2 with radiation unit 3 and illumination optics unit 4, and a projection optics system PL. The radiation system 2 comprises a source-collector module or radiation unit 3 and an illumination optics unit 4. Radiation unit 3 is provided with a radiation source 6 which may be a discharge plasma EUV radiation source. EUV radiation source 6 may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe gas, Li vapor or any other suitable gas or vapor may be required for efficient generation of the radiation. The radiation emitted by radiation source 6 is passed from the source chamber 7 into collector chamber 8 via a gas barrier structure or "foil trap" 9. The gas barrier structure 9 comprises a channel structure such as, for instance, described in detail in European patent applications EP-A-1 233 468 and EP-A-1 057 079, which are incorporated herein by reference.

The collector chamber 8 comprises a radiation collector 10 which according to the present invention is formed by a grazing incidence collector. Radiation passed by collector 10 is reflected off a grating spectral filter 11 to be focused in a virtual source point 12 at an aperture in the collector chamber 8. From chamber 8, the projection beam 16 is reflected in illumination optics unit 4 via normal incidence reflectors 13, 14 onto a reticle or mask positioned on reticle or mask table MT. A patterned beam 17 is formed which is imaged in projection optics system PL via reflective elements 18, 19 onto wafer stage or substrate table WT. More elements than shown may generally be present in illumination optics unit 4 and projection optics system PL.

Figure 3:
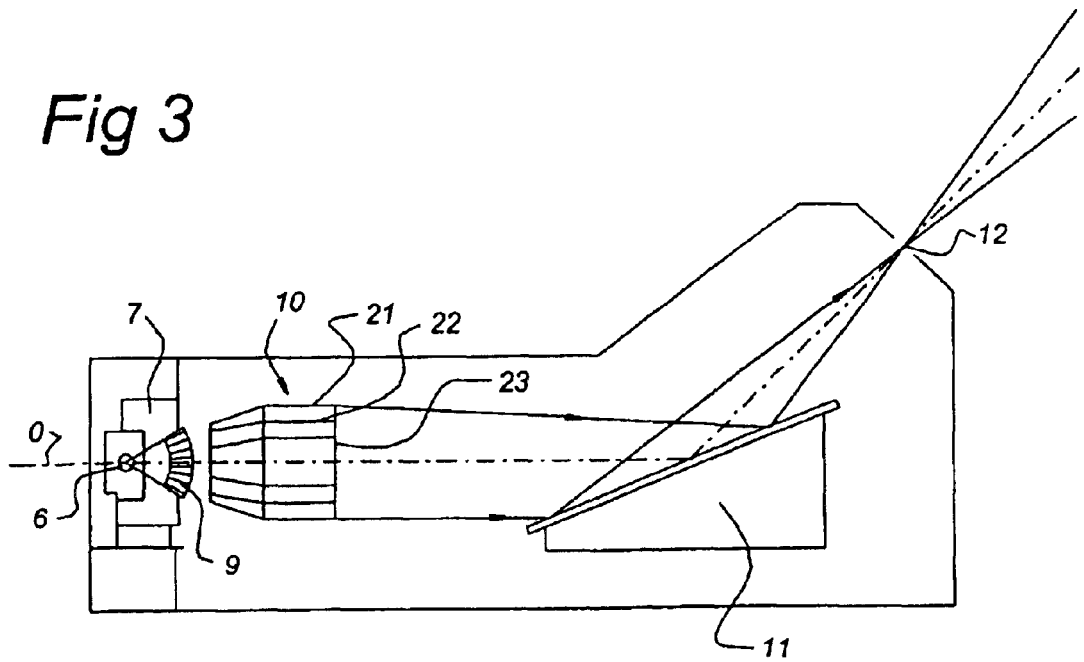
FIG. 3 shows a detail of the radiation source and grazing incidence collector of the present invention.

As can be seen in FIG. 3, the grazing incidence collector 10 comprises a number of nested reflector elements 21, 22, 23. A grazing incidence collector of this type is, for instance, shown in German patent application DE 101 38 284.7.

Figure 4:
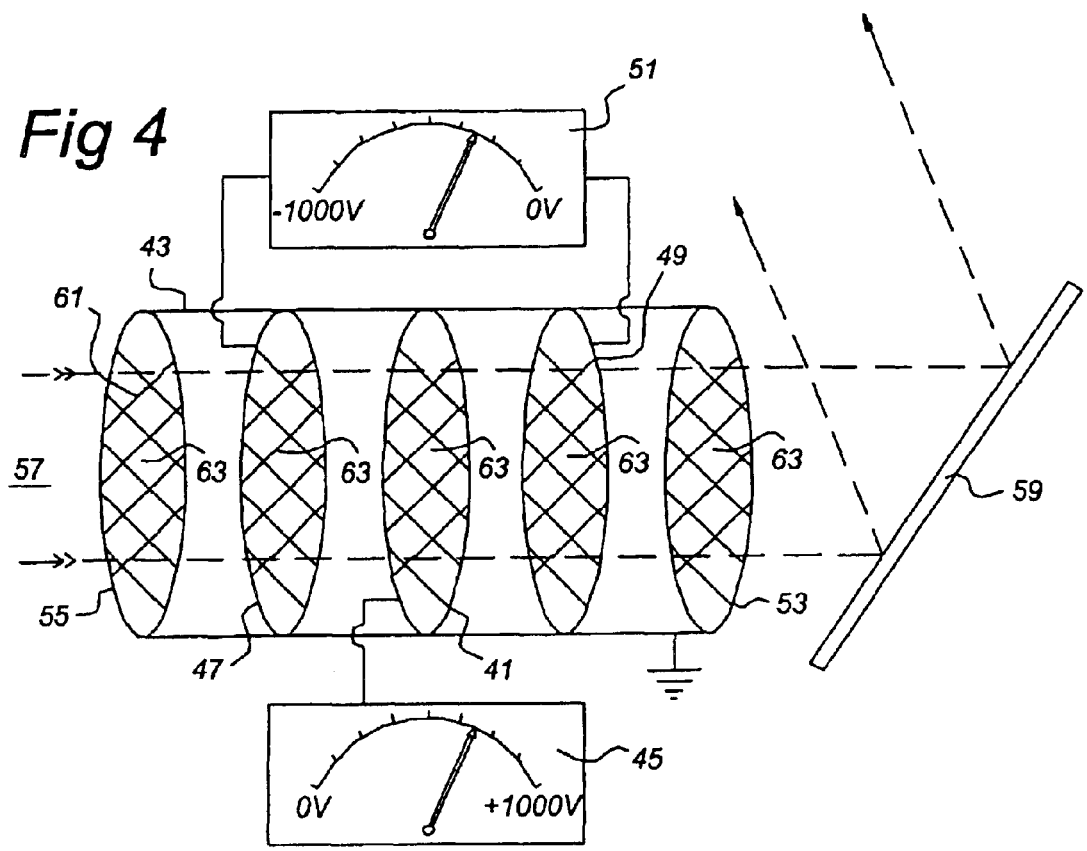
FIG. 4 schematically shows the lay-out of an embodiment of the shielding means according to the present invention.

In FIG. 4, a first screen, such as a mesh 41, is shown mounted inside a grounded housing, such as a cylinder casing 43. The first screen is in the EUV beam 57. Positively charged particles emitted by the radiation source 6 travel along the EUV beam 57. The mesh 41 is connected to a voltage supply 45 which provides a positive voltage. The first screen may also be a grid. The mesh 41 comprises a plurality of wires 61 and apertures 63. The thickness of each wire is substantially smaller than the distance between adjacent wires. This ensures that obscuration of the EUV beam 57 is as small as possible. The mesh 41 is electrically isolated from the grounded cylindrical casing 43. On both sides of the first mesh 41, a second screen in the form of two additional meshes 47, 49 are mounted in and electrically isolated from the grounded cylinder casing 43. The additional meshes 47, 49 are connected to voltage supply 51, which provides a negative voltage in order to repel free electrons. At the end faces of the grounded cylindrical casing 43, a third screen, such as two additional meshes 53, 55 in electrical contact with the grounded cylinder casing 43, may be located. As shown in FIG. 4, the EUV beam 57 enters in parallel and continues through the assembly of the meshes 41, 47, 49, 53, 55, which are aligned to minimize shadow effects on an optical component 59. The optical component 59 may be, for example, a mirror. Convergent or divergent beams 57 of (EUV) radiation may be used as well. If convergent or divergent beams 57 of radiation are used, the alignment and the pitch of the meshes 41, 47, 49, 53, 55 would to be adjusted accordingly.

Short-circuiting of the meshes 41, 47, 49, 53, 55 due to deposition of an electrically conductive layer by the EUV beam 57 should be prevented. To this end, insulating media are present between the meshes 41, 47, 49, 53, 55. A groove is cut in the insulating media in which metal atoms can only penetrate with difficulty. This means that deep inside the groove there will be a section substantially free of conductive material. The geometry of the groove is, for example, a groove in the inner surface of the cylinder, perpendicular to the length of the cylinder.

Generating a high voltage (3 kV) on the first (middle) mesh 41 is very difficult with the EUV source operative and no voltage on the outer meshes 47, 49. The power needed to sustain such a high voltage is higher than 35W, and electrical breakdown phenomena are visible in the vacuum chamber and the radiation source does not run stable at these conditions. However, when a voltage in the order of −400 V is applied by the voltage source 51 to the meshes 47, 49, the 3 kV can be sustained very easily, and no side effects as breakdown or influence on the radiation source can be observed. The presence of the grounded casing 43, connected to the grounded meshes 53, 55 reduces the influence of the electrical fields generated by the meshes 41, 47, 49 further. The embodiment illustrated in FIG. 4 is suited for a parallel projection beam of radiation, but the same principle works in a comparable manner for a divergent or convergent projection beam of radiation.

Other components present in the lithographic projection apparatus, such as, for example, a foil trap, may be used as one of the meshes 41, 47, 49, 53, 55 described previously.

Figure 5:
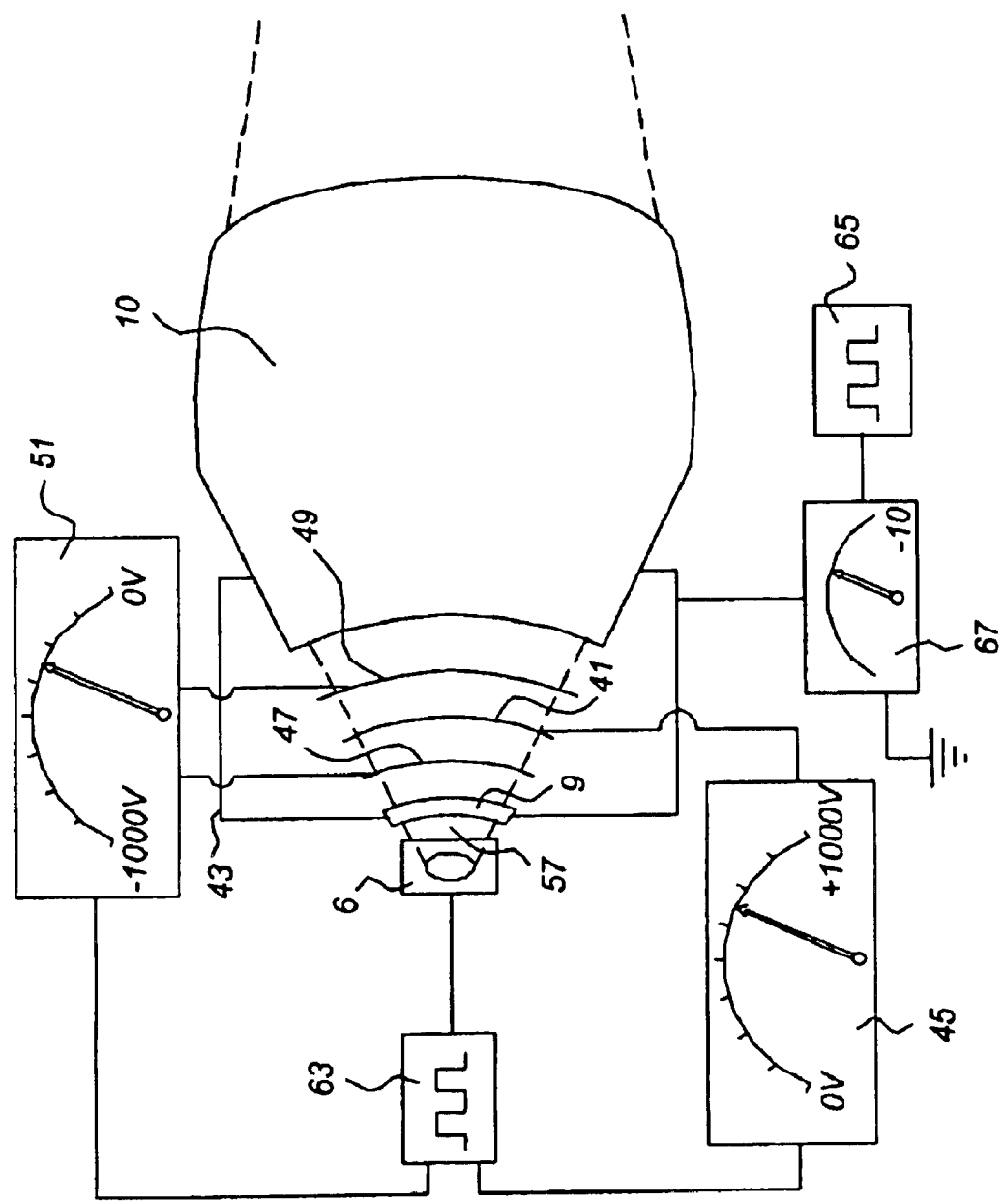
FIG. 5 shows the position of the shielding means focused on a radiation source in a lithographic projection apparatus according to the present invention.

FIG. 5, shows an enlarged detail of the source 6 and collector 10 shown in FIG. 2. As shown in FIG. 5, the foil trap 9 functions as the grounded mesh 55 and the collector 10 as the grounded mesh 53. The housing 43 of the foil trap 9 and the collector 10 are also grounded. The meshes 41, 47 and 49 are curved and have their focus on the radiation source 6 in order to minimize the interception of the projection beam of radiation, which in this case is a divergent beam. This maximizes the amount of radiation power that is present downstream of the meshes. The first and second screens may be thin wires in the shade of the platelets of the foil trap. Because the wires are not irradiated, they not be heated. Moreover, the foil trap platelets may be easily cooled.

In the embodiment shown in FIG. 5, the voltage on the meshes 41, 47, 49 may be pulsed by a timing circuit 63 that is connected to the radiation source 6 and the voltage sources 45 and 51. The timing circuit 63 synchronizes the pulsing of radiation source 6 and the pulsing of the voltage sources 45 and 51.

In operation, reference is made to the timing graphs of FIG. 6. In the lithographic projection apparatus, ions ("photo ions") are generated due to the ionizing properties of the EUV radiation during the state indicated as "high" in FIG. 6a during a period of time T1. More specifically, photo ions are generated between the first screening means 41 and the second screening means 47, 49. The photo ions are generated substantially immediately upon arrival of the EUV pulse. Photo ions capture means, such as the grounded cylindrical casing 43 or a wall with a relatively small (actively applied by a circuit 65) ion attracting magnetic or electric bias 67 (permanently or pulsed, such that attraction is only present during the low state of the source 6) can be provided to remove the photo ions in between the screening means. The photo-ion capture means serve to enhance the decay of the photo ion density.

Ions ejected from the EUV source ("source ions") are also present in the lithographic projection apparatus. The source ions, upon generation, travel along the path of the projection beam of radiation in the direction of the optical components of the lithographic projection apparatus. It is assumed that the source ions arrive after a period of time T2 at the second screen 47. In order to prevent the source ions from passing through the mesh 41, thereby protecting the optical components further downstream in the path of the projection beam of radiation against the source ions, a positive pulsed voltage is applied to the mesh 41. In order to have the source ion repelling effect, the positive voltage must be applied not later than a period T2 after the source is switched to the high state. The duration of the positive voltage pulse T3 must be such that the positive voltage is present for a period sufficiently long enough to decelerate the source ions. A longer pulse duration may lead to acceleration and a reflection of the source ions back to the source. A typical value for the duration of the positive pulse T3 is approximately 1 microsecond.

Depending on the time span during which ions are ejected from the radiation source, the duration of the positive pulse T3 may be somewhat longer than 1 microsecond, since there must be sufficient time also to decelerate the ions that arrive last at the second screen 47. The voltage pulse T3 should not be applied during the presence of the photo ions (e.g. during the period Ti in which the radiation source is in the high state, and a finite period of time after period T1 in which the photo ions are preferably removed). The time at which the pulse T3 is applied may vary, as may its shape, height, and width, as indicated in FIG. 6b by dashed lines. Because the photo ions require time to reach the capture means, there should be a time delay Tdelay, between the end of pulse Ti and the application of the positive voltage pulse during T3. Typical values for T1, T2 and T3 are 100 ns to a few microseconds. The second screen 47, 49 may also be (actively) biased. In order to obtain a strong source ion repelling field, the second screen may be biased in synchronism with the first screen 41 and substantially simultaneously with the pulse T3. This is illustrated in FIG. 6c. Both a pulsed voltage on the second screen and a constant voltage on the second screen, however, will result in a source ion repelling effect. The voltage should be switched on the first screen 41 on upon arrival of the source ions to the second screen 47.

As shown in FIG. 5, it is possible to provide a negative voltage of about −100 V to the housing 43 of the meshes 41, 47, 49 by a voltage source 67. This will cause an attracting force on the photo ions generated in between the meshes and carry these ions away from the meshes 41, 47, 49. A timing circuit 65 may be connected with the voltage source 67 in order to provide the negative voltage only during the periods in which these ions are present (i.e. T1 and some time afterwards).

The meshes assembly as described above is particularly suited to shield an optical component, such as for instance a mirror 59, against source induced debris.

While specific embodiments of the invention have been described above, it will be appreciated that the invention may be practiced otherwise than as described. The description is not intended to limit the invention.

What is claimed is:

1. A lithographic projection apparatus comprising:
   a radiation system to transmit a beam of radiation emitted from a radiation source;
   a support structure constructed to hold a patterning structure to be irradiated by the beam of radiation, said patterning structure adapted to pattern the beam;
   a substrate holder constructed to hold a substrate;
   a projection system constructed and arranged to project an irradiated portion of the patterning structure onto a target portion of the substrate;
   a first screen positioned in a path of the beam of radiation between the radiation source and an optical element to be screened from positively charged particles, the first screen being substantially transparent to the beam of radiation, and a positive voltage being applied to the first screen to repel at least a portion of the positively charged particles away from the optical element; and
   a second screen positioned in the path of the beam of radiation on at least one side of the first screen, a negative voltage being applied to the second screen to repel negative particles away from the first screen.

2. A lithographic projection apparatus according to claim 1, wherein the lithographic projection apparatus further comprises a surface which is either grounded or in electrical contact with the second screen to screen the radiation source from the first screen.

3. A lithographic projection apparatus according to claim 2, wherein the surface comprises a cylindrically or conically shaped casing, a longitudinal axis of the casing being substantially parallel to the path of the beam of radiation.

4. A lithographic projection apparatus according to claim 1, wherein the first screen and the second screen comprise a grid or mesh structure having a surface substantially perpendicular to the path of the beam of radiation.

5. A lithographic projection apparatus according to claim 1, wherein the second screen and the first screen comprise apertures which are mutually aligned along the path of the beam of radiation.

6. A lithographic projection apparatus according to claim 1, wherein the lithographic projection apparatus further comprises a third screen substantially at ground potential, positioned on a first side of the second screen opposite a second side facing the first screen.

7. A lithographic projection apparatus according to claim 6, wherein the third screen is of a similar structure as the first screen and the second screen.

8. A lithographic projection apparatus according to claim 1, wherein the positive voltage applied to the first screen is between about 0 V and about 20 kV.

9. A lithographic projection apparatus according to claim 8, wherein the positive voltage applied to the first screen is about 3 kV.

10. A lithographic projection apparatus according to claim 1, wherein the second screen is on a negative potential of between about −2 kV and about 0 V.

11. A lithographic projection apparatus according to claim 10, wherein the negative potential is about −400 V.

12. A lithographic projection apparatus according to claim 1, wherein the radiation source is adapted to be operated in a pulsed manner between a high state and a low state, and wherein the lithographic projection apparatus further comprises a synchronization device, the synchronization device being adapted to apply to the first screen a positive voltage during at least a part of the time the radiation source is in a low state.

13. A lithographic projection apparatus according to claim 12, wherein the positive voltage on the first screen is present for a period of a few microseconds.

14. A lithographic projection apparatus according to claim 12, wherein the second screen is connected to the synchronization device for varying the voltage applied to the second screen in synchronization with the positive voltage applied to the first screen.

15. A lithographic projection apparatus according to claim 12, wherein at least one wall is present in between the first screen and the second screen for capturing positively charged particles.

16. A lithographic projection apparatus according to claim 15, wherein the lithographic projection apparatus further comprises a photo ion capture structure for attracting positively charged particles towards the at least one wall.

17. A method of manufacturing an integrated structure by a lithographic process comprising:

transmitting a beam of radiation emitted from a radiation source;

patterning the beam of radiation;

projecting the beam of radiation onto a substrate;

screening the beam of radiation between the radiation source and at least one optical component with a first screen by applying a positive voltage to the first screen; and screening the beam of radiation on at least one side of the first screen with a second screen by applying a negative voltage to the second screen.

* * * * *